United States Patent
Kawata

(10) Patent No.: US 9,166,393 B2
(45) Date of Patent: Oct. 20, 2015

(54) DRIVER CIRCUIT AND TELEVISION SET USING THE SAME

(71) Applicant: Rohm Co., Ltd., Kyoto (JP)

(72) Inventor: Shinji Kawata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 181 days.

(21) Appl. No.: 13/938,401

(22) Filed: Jul. 10, 2013

(65) Prior Publication Data

US 2014/0016240 A1    Jan. 16, 2014

(30) Foreign Application Priority Data

Jul. 11, 2012 (JP) .................................. 2012155698

(51) Int. Cl.
| | |
|---|---|
| *H02H 3/093* | (2006.01) |
| *H03K 17/082* | (2006.01) |
| *G09G 3/36* | (2006.01) |

(52) U.S. Cl.
CPC ........... *H02H 3/0935* (2013.01); *G09G 3/3674* (2013.01); *H03K 17/0822* (2013.01); *G09G 2330/00* (2013.01)

(58) Field of Classification Search
CPC .............. H02H 3/0935; G09G 3/3674; G09G 2330/00; H03K 17/0822

USPC ............................................................ 361/95

See application file for complete search history.

(56) References Cited

U.S. PATENT DOCUMENTS

| | | | | |
|---|---|---|---|---|
| 2007/0247774 | A1* | 10/2007 | Cheng et al. ................. | 361/93.1 |
| 2008/0253047 | A1* | 10/2008 | Takihara et al. ................ | 361/57 |
| 2011/0141092 | A1* | 6/2011 | Kawagoshi ................... | 345/211 |

FOREIGN PATENT DOCUMENTS

JP          06-311734       11/1994

* cited by examiner

*Primary Examiner* — Scott Bauer

(74) *Attorney, Agent, or Firm* — Fish & Richardson P.C.

(57) ABSTRACT

A driver circuit includes: a first transistor connected between a line of first voltage and an output terminal; a first overcurrent detector configured to output a first signal when overcurrent flows into the first transistor; a first control unit configured to turn on and off the first transistor at a predetermined period and turn off the first transistor when the first signal is output from the first overcurrent detector; and a counter configured to count the number of times by which the first signal is output from the first overcurrent detector within a predetermined time interval, and to output a shut-down signal to stop an operation of the driver circuit as a value of the count reaches a predetermined value of equal to or more than 2.

4 Claims, 17 Drawing Sheets

FIG. 5

| Input | | Output | | |
|---|---|---|---|---|
| STV | CPVx | CKVx | CKVBx | Charge sharing |
| L | L | HiZ | HiZ | ON |
| L | Charge sharing | Toggle state | Toggle state | OFF |
| H | L | VOFF | VON | OFF |
| H | H | VON | VOFF | OFF |

FIG. 6

| Input | | Output |
|---|---|---|
| STV | CPV1 | STVP |
| L | — | VOFF |
| H | L | VON |
| H | H | HiZ | ns
DRIVER CIRCUIT AND TELEVISION SET USING THE SAME

CROSS-REFERENCE TO RELATED APPLICATION

This application is based upon and claims the benefit of priority from Japanese Patent Applications No. 2012-155698, filed on Jul. 11, 2012, the entire contents of which are incorporated herein by reference.

TECHNICAL FIELD

The present disclosure relates to a driver circuit, and more particularly relates to a driver circuit having an overcurrent protection function.

BACKGROUND

In a liquid crystal display, a plurality of gate lines (GL) is sequentially selected and a positive voltage is applied to the selected gate line (GL) while a negative voltage is applied to the other gate lines (GL). For example, if one gate line GL is circuit-shorted to a negative voltage line through a defect, overcurrent flows into transistors of a driver circuit when a positive voltage is applied to the gate line GL. Since such overcurrent flowing into the transistors may overheat or damage the transistors, there is a need to turn off the transistors.

As one of methods for detecting overcurrent of transistors, there has been proposed a method for detecting a voltage drop due to on-resistance of transistors and determining that overcurrent flows into transistors if the detected voltage drop exceeds a predetermined voltage.

However, in a method of turning off the transistors when the overcurrent flows into the transistors, no overcurrent is detected when the transistors are turned off, and then, when a normal gate line GL not circuit-shorted is selected, a driver circuit is normally operated. This may result in repeated overcurrent flown in the gate line GL and hence overheating and damage of the transistors.

SUMMARY

The present disclosure provides some embodiments of a driver circuit capable of protecting transistors against overcurrent.

According to one embodiment of the present disclosure, there is provided a driver circuit including: a first transistor connected between a line of first voltage and an output terminal; a first overcurrent detector configured to output a first signal when overcurrent flows into the first transistor; a first control unit configured to turn on and off the first transistor at a predetermined period and turn off the first transistor when the first signal is output from the first overcurrent detector; and a counter configured to count the number of times by which the first signal is output from the first overcurrent detector within a predetermined time interval, and to output a shut-down signal to stop an operation of the driver circuit as a value of the count reaches a predetermined value of equal to or more than 2.

In some embodiments, the driver circuit further includes: a second transistor connected between the output terminal and a line of second voltage lower than the first voltage; a second overcurrent detector configured to output a second signal when overcurrent flows into the second transistor; and a second control unit configured to turn on and off the second transistor alternately at a predetermined period and turn off the second transistor when the second signal is output from the second overcurrent detector. The first and second transistors are alternately turned on. The counter counts the number of times by which the first and second signals are output from the first and second overcurrent detectors within the predetermined time interval, and outputs the shut-down signal as a value of the count reaches the predetermined value.

In some embodiments, two sets of the output terminals, the first and second transistors, the first and second overcurrent detectors and the first and second control units are provided. The two first transistors are alternately turned on and the two second transistors are alternately turned on. The counter counts the number of times by which the first and second signals are output from the two sets of the first and second overcurrent detectors within the predetermined time interval, and outputs the shut-down signal as a value of the count reaches the predetermined value.

In some embodiments, between a first time interval during which one set of the first transistor and the other set of the second transistor are turned on and a second time interval during which one set of the second transistor and the other set of the first transistor are turned on, a third time interval during which both sets of the first and second transistors are turned off is provided. The two output terminals are connected to two load circuits, respectively. The driver circuit further comprises a charge sharing circuit configured to interconnect the two output terminals during the third time interval and flow current from one of the load circuits, which is charged with the first voltage, to the other of the load circuits, which is charged with the second voltage.

In some embodiments, the first voltage is a positive voltage and the second voltage is a negative voltage. In some embodiments, the output terminal is connected to a gate line of a liquid crystal display panel.

BRIEF DESCRIPTION OF THE DRAWINGS

FIG. 5 is a view showing a relationship between an input and an output of the IC shown in FIG. 4.

FIG. 6 is a view showing another relationship between an input and an output of the IC shown in FIG. 4.

DETAILED DESCRIPTION

Figure 1:
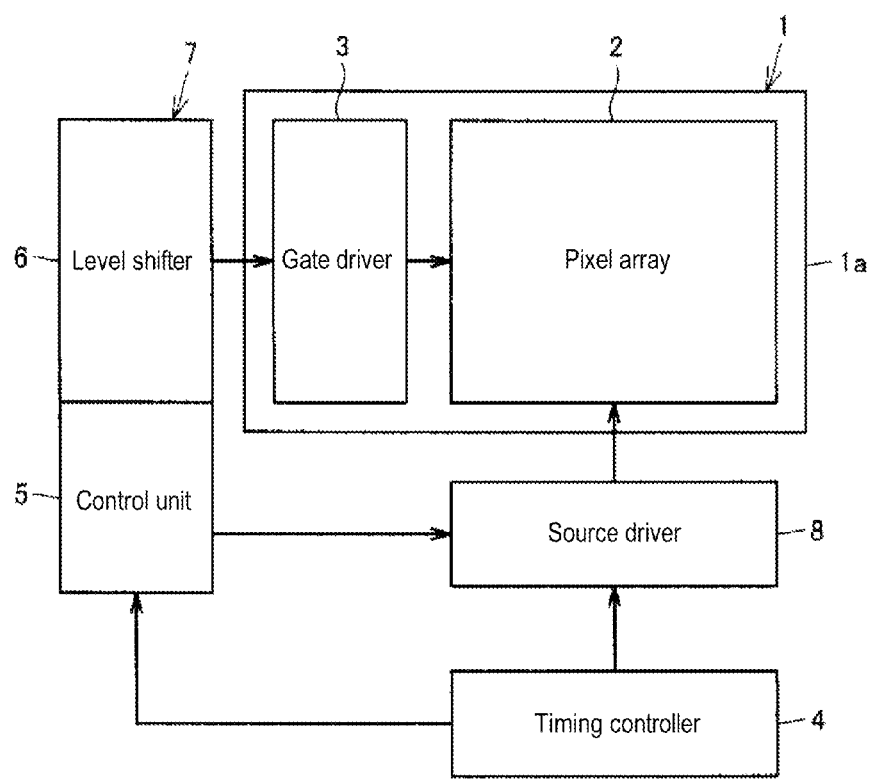
FIG. 1 is a block diagram showing main parts of a liquid crystal display according to one embodiment of the present disclosure.

FIG. 1 is a block diagram showing main parts of a liquid crystal display according to one embodiment of the present disclosure. The liquid crystal display according to one embodiment of the present disclosure includes a liquid crystal display panel 1, a timing controller 4, a control unit 5, a level shifter 6 and a source driver 8, as shown in FIG. 1. The control unit 5 and the level shifter 6 may be integrated into a single IC 7.

The liquid crystal display panel 1 includes a transparent substrate 1a, a pixel array 2 and a gate driver 3 formed on the transparent substrate 1a.

Figure 2:
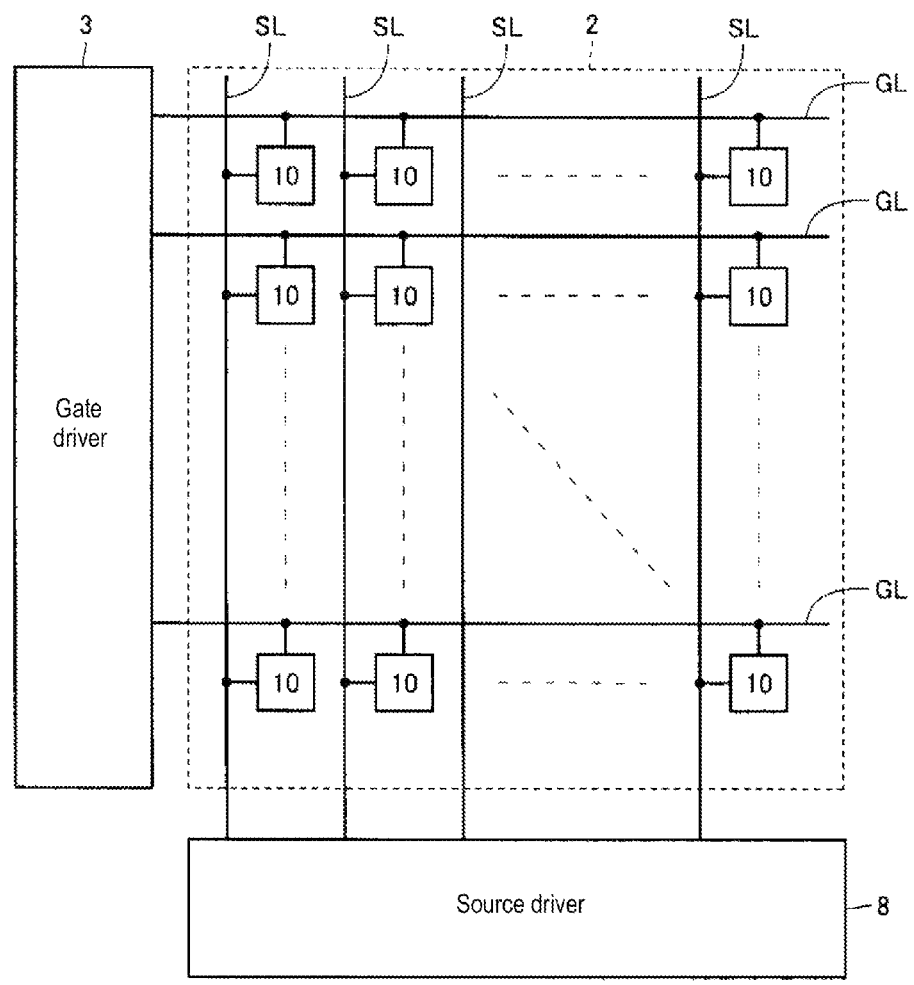
FIG. 2 is a block diagram showing a configuration of a pixel array shown in FIG. 1.

FIG. 2 is a block diagram showing a configuration of the pixel array 2 shown in FIG. 1. As shown in FIG. 2, the pixel array 2 includes a plurality of pixel circuits 10 arranged in plural rows and plural columns, a plurality of gate lines GL arranged in association with the plural rows, and a plurality of source lines SL arranged in association with the plural columns. One end of each gate line GL is connected to the gate driver 3 and one end of each source line SL is connected to the source driver 8.

Figure 3:
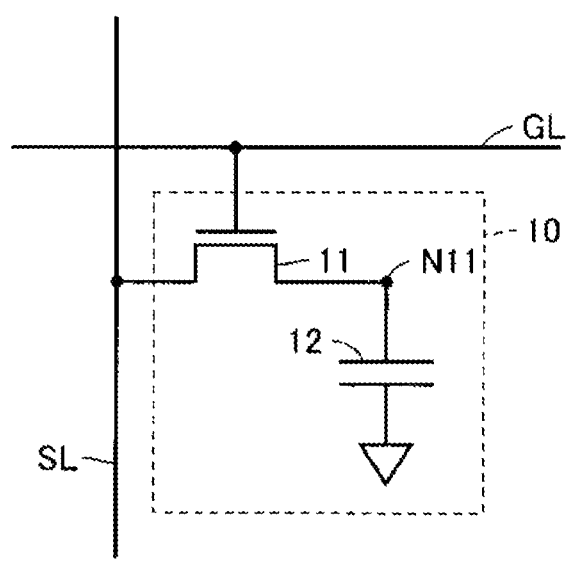
FIG. 3 is a circuit diagram showing a configuration of a pixel circuit shown in FIG. 2.

FIG. 3 is a circuit diagram showing a configuration of the pixel circuit 10 shown in FIG. 2. As shown in FIG. 3, each pixel circuit 10 includes a thin film transistor (TFT) 11 and a liquid crystal cell 12. The TFT 11 includes a gate connected to a corresponding gate line GL, a source connected to a corresponding line SL, and a drain connected to a reference voltage line via the liquid crystal cell 12. The liquid crystal cell 12 includes a liquid crystal sealed between two transparent electrodes.

When the gate line GL has a "low (L)" level (or a negative voltage VOFF), the TFT 11 is turned off. When the gate line GL has a "high (H)" level (or a positive voltage VON), the TFT 11 is turned on and a voltage of the source line SL is written into a memory node N11 between the drain of the TFT 11 and the liquid crystal cell 12. A light transmittance of the liquid crystal cell 12 is varied depending on the voltage written into the memory node N11.

Referring to FIG. 1 again, the timing controller 4 controls operation timings of the IC 7 and the source driver 8. The control unit 5 controls the gate driver 3 via the level shifter 6 while controlling the source driver 8. The level shifter 6 shifts a level of a control signal received from the control unit 5 and provides it to the gate driver 3.

The gate driver 3 selects one of the plurality of gate lines GL of the pixel array 2 sequentially every predetermined interval, sets the selected gate line GL to an "H" level, and turns on a corresponding TFT 11 associated with the gate line GL. The source driver 8 writes a voltage having a level corresponding to an image signal into the memory node N11 of the pixel circuit 10 associated with the selected gate line GL via each source line SL. Based on the image signal, once voltages are written into respective memory nodes N11 of all pixel circuits 10 included in the pixel array 2, one image is displayed on the pixel array 2.

Figure 4:
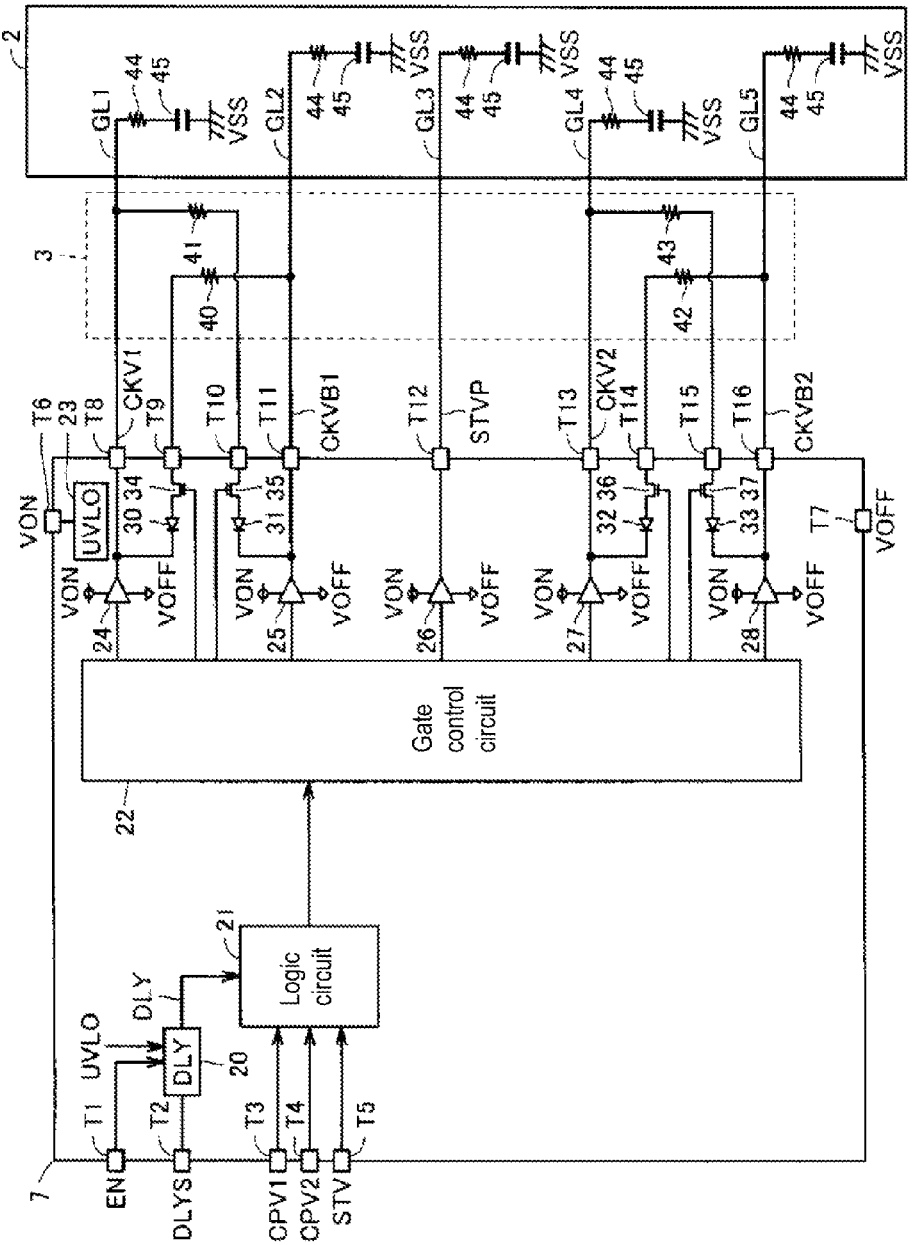
FIG. 4 is a circuit block diagram showing a portion related to a level shifter in an IC (Integrated Circuit) shown in FIG. 1.
Figure 7:
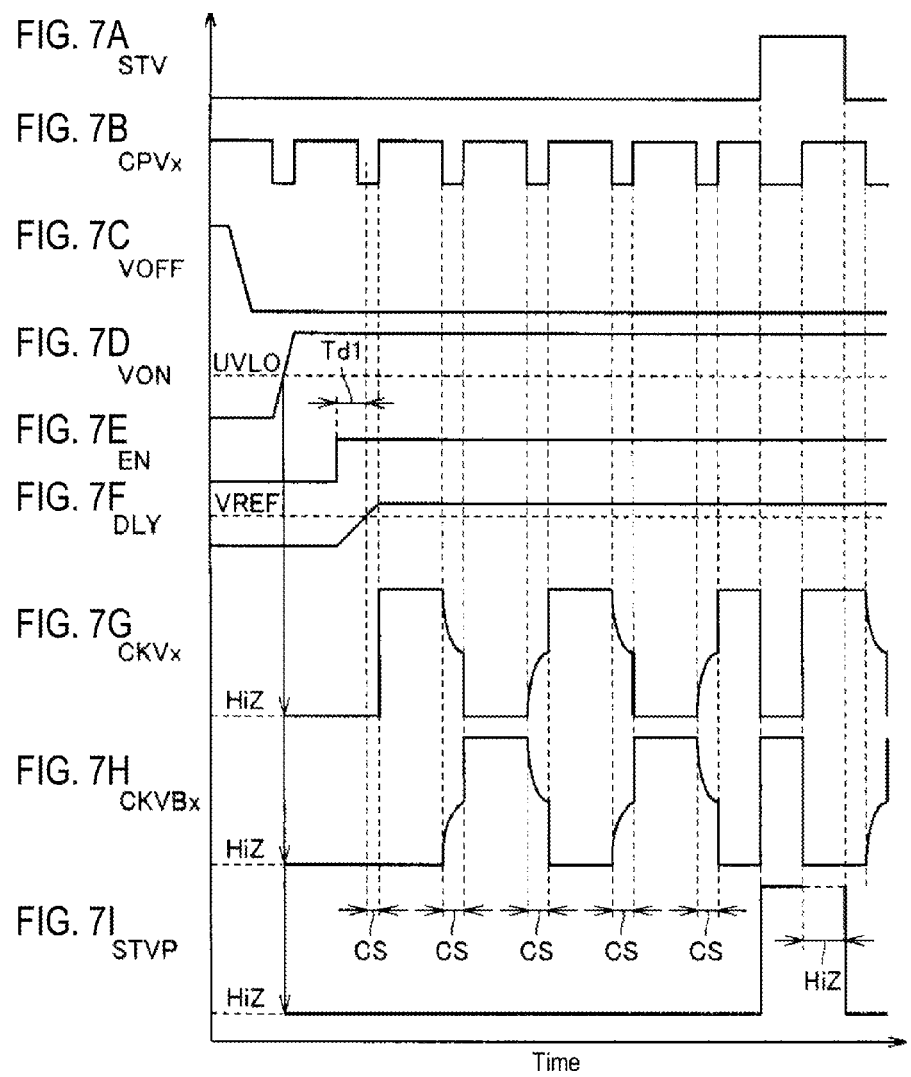
FIGS. 7A to 7I are timing charts showing an operation of the IC shown in FIG. 4.

FIG. 4 is a circuit block diagram showing a portion related to the level shifter 6 in the IC 7 shown in FIG. 1. As shown in FIG. 4, the IC 7 includes terminals T1 to T16, a delay generation circuit 20, a logic circuit 21, a gate control circuit 22, a UVLO (Under Voltage Lock Out) generation circuit 23, drivers 24 to 28, diodes 30 to 33 and N channel MOS (Metal Oxide Semiconductor) transistors 34 to 37.

The terminals T1 to T5 receive respective signals EN, DLYS, CPV1, CPV2 and STV from the timing controller 4. The terminals T6 and T7 receive a positive voltage VON and a negative voltage VOFF, respectively. The terminals T8 to T16 are connected to gate lines GL1 to GL5 selected from the pixel array 2 via the gate driver 3.

The UVLO generation circuit 23 raises a signal UVLO from an "L" level to an "H" level as the voltage VON is input. When the signal UVLO has the "L" level, the delay generation circuit 20 is activated. When both of the signals EN and DLYS have an "L" level, the delay generation circuit 20 raises a signal DLY from an "L" level to an "H" level. When the signal DLY has the "H" level, the logic circuit 21 and the gate control circuit 22 are activated.

The logic circuit 21 generates an internal control signal based on the signals CPV1, CPV2 and STV. The gate control circuit 22 controls the driver 24 and the N channel MOS transistors 34 to 37 based on the internal control signal from the logic circuit 21.

Each of the drivers 24 to 28 is controlled by the gate control circuit 22 and outputs a positive voltage VON or a negative voltage VOFF to an output node or renders the output node into a high impedance state (HiZ). Output nodes of the drivers 24 to 28 are connected to the terminals T8, T11, T12, T13 and T16, respectively. Output signals of the drivers 24 to 28 are denoted by CKV1, CKVB1, STVP, CKV2 and CKVB2, respectively.

Cathodes of the diodes 30 to 33 are connected to the terminals T8, T11, T13 and T16, respectively. Sources of the N channel MOS transistors 34 to 37 are respectively connected to anodes of the diodes 30 to 33, drains thereof are respectively connected to the terminals T9, T10, T14 and T15, and gates thereof are connected to the gate control circuit 22.

The terminals T8 and T10 are connected to one gate line GL1 via the gate driver 3. The terminals T9 and T11 are connected to one gate line GL2 via the gate driver 3. The terminal T12 is connected to one gate line GL3 via the gate driver 3. The terminals T13 and T15 are connected to one gate line GL4 via the gate driver 3. The terminals T14 and T16 are connected to one gate line GL5 via the gate driver 3.

Each gate line GL is a capacitive load including a resistive element 44 and a capacitor 45 connected in series. The drivers 24 and 25 charges one (for example, GL1) of two gate lines GL1 and GL2 with a positive voltage VON, while charging the other (for example, GL2) with a negative voltage VOFF.

When voltages of the two gate lines GL1 and GL2 are re-written, both of the output signals CKV1 and CKVB1 of the drivers 24 and 25 are rendered into HiZ and at the same time, the transistor 34 or 35 is turned on to allow the two gate lines GL1 and GL2 to share charges stored in the two gate lines GL1 and GL2. Thus, both of the voltages of the gate lines GL1 and GL2 become equal to (VON+VOFF)/2. This operation called "charge sharing" can achieve reduction in power consumption.

For example, when the gate lines GL1 and GL2 are charged with the positive voltage VON and the negative voltage VOFF, respectively, the transistor 35 is turned on. Accordingly, current flows from the gate line GL1 into the gate line GL2 via the transistor 35 and the diode 31 and both of the voltages of the gate lines GL1 and GL2 become equal to (VON+VOFF)/2.

On the contrary, when the gate lines GL2 and GL1 are charged with the positive voltage VON and the negative voltage VOFF, respectively, the transistor 34 is turned on. Accordingly, current flows from the gate line GL2 into the gate line GL1 via the transistor 34 and the diode 30 and both of the voltages of the gate lines GL1 and GL2 become equal to (VON+VOFF)/2.

In addition, in the charge sharing operation, time taken until the voltages of the gate lines GL1 and GL2 become equal to (VON+VOFF)/2 is adjusted by a resistive element 40 interposed between the terminal T9 and the gate line GL2 and a resistive element 41 interposed between the terminal T10 and the gate line GL1. The driver 26 charges the gate line GL3 with the positive voltage VON or the negative voltage VOFF.

The drivers 27 and 28 charge one (for example, GL4) of two gate lines GL4 and GL5 with a positive voltage VON, while charging the other (for example, GL5) with a negative voltage VOFF.

When voltages of the two gate lines GL4 and GL5 are re-written, both of the output signals CKV2 and CKVB2 of the drivers 27 and 28 are rendered into HiZ and at the same time, the transistor 36 or 37 is turned on to allow the two gate lines GL4 and GL5 to share charges stored in the two gate lines GL4 and GL5. Thus, both of the voltages of the gate lines GL4 and GL5 become equal to (VON+VOFF)/2.

In addition, in the charge sharing operation, time taken until the voltages of the gate lines GL4 and GL5 become equal to (VON+VOFF)/2 is adjusted by a resistive element 42 interposed between the terminal T14 and the gate line GL5 and a resistive element 43 interposed between the terminal T15 and the gate line GL4.

FIG. 5 is a view showing a relationship between an input and an output of the IC 7 shown in FIG. 4. In FIG. 5, if both of signals STV and CPVx (where, x is 1 or 2) have an "L" level, both of signals CKVx and CKVBx are rendered into HiZ and a charge sharing operation is turned on.

In addition, if the signal STV has an "L" level, when the signal CPVx rises from the "L" level to the "H" level, each of the signals CKVx and CKVBx enters a toggle state and the charge sharing operation is turned off.

In addition, if the signals STV and CPVx have an "H" level and an "L" level, respectively, the signals CKVx and CKVBx have a negative voltage VOFF and a positive voltage VON, respectively, and the charge sharing operation is turned off.

In addition, if both of the signals STV and CPVx have an "H" level, the signals CKVx and CKVBx have a positive voltage VON and a negative voltage VOFF, respectively, and the charge sharing operation is turned off.

FIG. 6 is a view showing another relationship between an input and an output of the IC 7 shown in FIG. 4. In FIG. 6, if the signal STV has an "L" level, the signal STVP has a negative voltage VOFF irrespective of the signal CPV1. If the signals STV and CPV1 have an "H" level and an "L" level, respectively, the signal STVP has a positive voltage VON. If both of the signals STV and CPV1 have an "H" level, the signal STVP is rendered into HiZ.

FIGS. 7A to 7I are timing charts showing an operation of the IC 7 shown in FIG. 4. As shown in FIGS. 7A to 7I, in the initial state, the signal STV has an "L" level and the signal CPVx alternates between an "H" level and an "L" level at a predetermined period. An interval during which the signal CPVx has the "H" level is longer than an interval during which the signal CPVx has the "L" level. The signals EN and DLY have an "L" level and the signals CKVx, CKVBx and STVP remain in HiZ.

When a negative voltage VOFF and a positive voltage VON are input, the signal UVLO has an "H" level and the signals CKVx, CKVBx and STVP have a negative voltage VOFF. Next, when a signal EN rises from an "L" level to an "H" level, the signal DLY rises from an "L" level toward an "H" level. When the signal DLY exceeds a reference voltage VREF after lapse of a predetermined period of time (Td1), a charge sharing operation (CS) for the signals CKVx and CKVBx is performed.

In addition, in the charge sharing period, the output nodes of the drivers 24, 25, 27 and 28 are rendered into HiZ and at the same time, the transistor 34 or 35 and the transistor 36 or 37 are turned on. Thus, charges stored in the gate lines GL can be effectively used to reduce power consumption.

Next, when the signal CPVx rises from an "L" level to an "H" level, the charge sharing operation (CS) for the signals CKVx and CKVBx is stopped and at the same time, the signals CKVx and CKVBx enter a toggle state to have a positive voltage VON and a negative voltage VOFF, respectively. Subsequently, when the signal CPVx falls from an "H" level to an "L" level, the charge sharing operation (CS) for the signals CKVx and CKVBx is performed to make both of the signals CKVx and CKVBx equal to (VON+VOFF)/2.

Next, when the signal CPVx rises from an "L" level to an "H" level, the charge sharing operation (CS) for the signals CKVx and CKVBx is stopped and at the same time, the signals CKVx and CKVBx enter a toggle state to have a negative voltage VOFF and a positive voltage VON, respectively. Subsequently, when the signal CPVx falls from an "H" level to an "L" level, the charge sharing operation (CS) for the signals CKVx and CKVBx is performed to make both of the signals CKVx and CKVBx equal to (VON+VOFF)/2.

After this procedure is repeated, when the signals STV and CPVx have an "H" level to an "L" level at any timing, respectively, the signals CKVx, CKVBx and STVP have a negative voltage VOFF, a positive voltage VON and a positive voltage VON, respectively. Subsequently, when both of the signals STV and CPVx have an "H" level, the signals CKVx, CKVBx and STVP have a positive voltage VON, a negative voltage VOFF and a high impedance state (HiZ), respectively.

In the above-described liquid crystal display, there may be some cases where a gate line GL and a line of positive voltage VON are circuit-shorted through a defect, where a gate line GL and a line of negative voltage VOFF are circuit-shorted through a defect, and two gate lines GL are circuit-shorted through a defect. In such cases, overcurrent flows into the drivers 24 to 28 to heat the IC 7, which may cause damage of the IC 7. To avoid this problem, the IC 7 is equipped with a function to protect the drivers 24 to 28 against overcurrent. This overcurrent protection function of the drivers 24 to 28 will now be described in detail.

Figure 8:
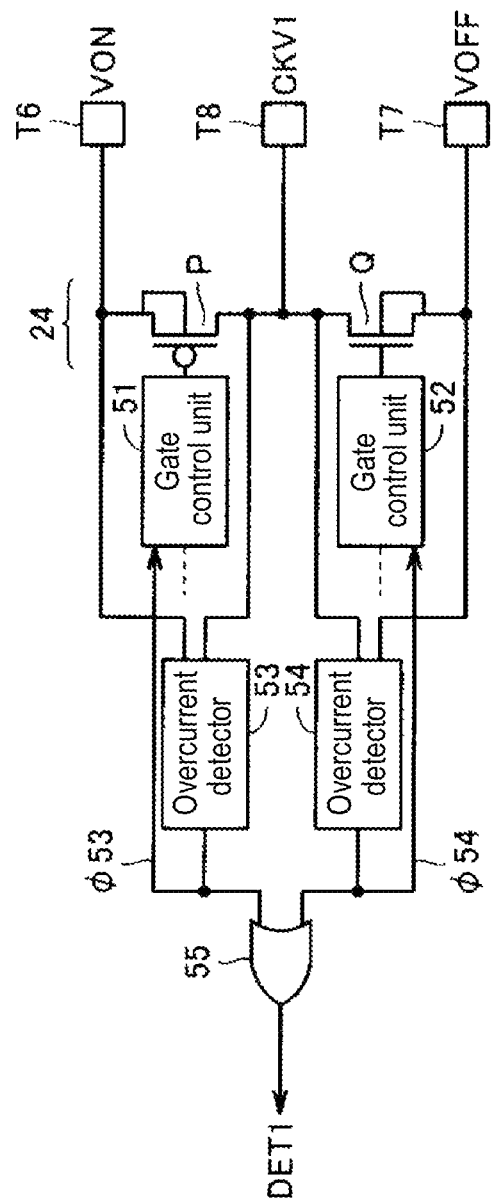
FIG. 8 is a circuit block diagram showing a portion related to overcurrent protection in the IC shown in FIG. 1.

FIG. 8 is a circuit block diagram showing a portion related to overcurrent protection of the driver 24 in the gate control circuit 22. As shown in FIG. 8, the driver 24 includes a P channel MOS transistor P connected between the terminals T6 and T8, and an N channel MOS transistor Q connected between the terminals T8 and T7. In addition, gate control units 51 and 52, overcurrent detectors 53 and 54 and an OR gate 55 are provided in association with the driver 24.

The gate control unit 51 is connected to a gate of the P channel MOS transistor P and turns on or off the P channel MOS transistor P based on an internal control signal. The gate control unit 52 is connected to a gate of the N channel MOS transistor Q and turns on or off the N channel MOS transistor Q based on an internal control signal.

When the signal CKV1 has a positive voltage VON, the transistor P is turned on and at the same time, the transistor Q is turned off. When the signal CKV1 has a negative voltage VOFF, the transistor P is turned off and at the same time, the transistor Q is turned on. When the signal CKV1 has a high impedance state (HiZ), both of the transistors P and Q are turned off.

The overcurrent detector 53 detects a source-drain voltage V1 of the P channel MOS transistor P, determines that overcurrent flows into the transistor P if the detected voltage V1 exceeds a predetermined threshold voltage VTP, and raises an overcurrent detection signal φ53 from an "L" level to an "H" level based on the determination. When the overcurrent detection signal φ53 has the "H" level, the gate control unit 51 turns off the transistor P irrespective of the internal control signal.

The overcurrent detector 54 detects a drain-source voltage V2 of the N channel MOS transistor Q, determines that overcurrent flows into the transistor Q if the detected voltage V2 exceeds a predetermined threshold voltage VTN, and raises an overcurrent detection signal φ54 from an "L" level to an "H" level based on the determination. When the overcurrent detection signal φ54 has the "H" level, the gate control unit 52 turns off the transistor Q irrespective of the internal control signal. The OR gate 55 outputs an OR signal DET1 resulting from an OR operation for the overcurrent detection signals φ53 and φ54.

Each of the drivers 25 to 28 has the same configuration as the driver 24 and gate control units 51 and 52, overcurrent detectors 53 and 54 and an OR gate 55 are provided in association with each of the drivers 25 to 28, like the driver 24. The OR gates 55 in association with the drivers 24 to 28 output the respective signals DET1 to DET5.

Figure 9:
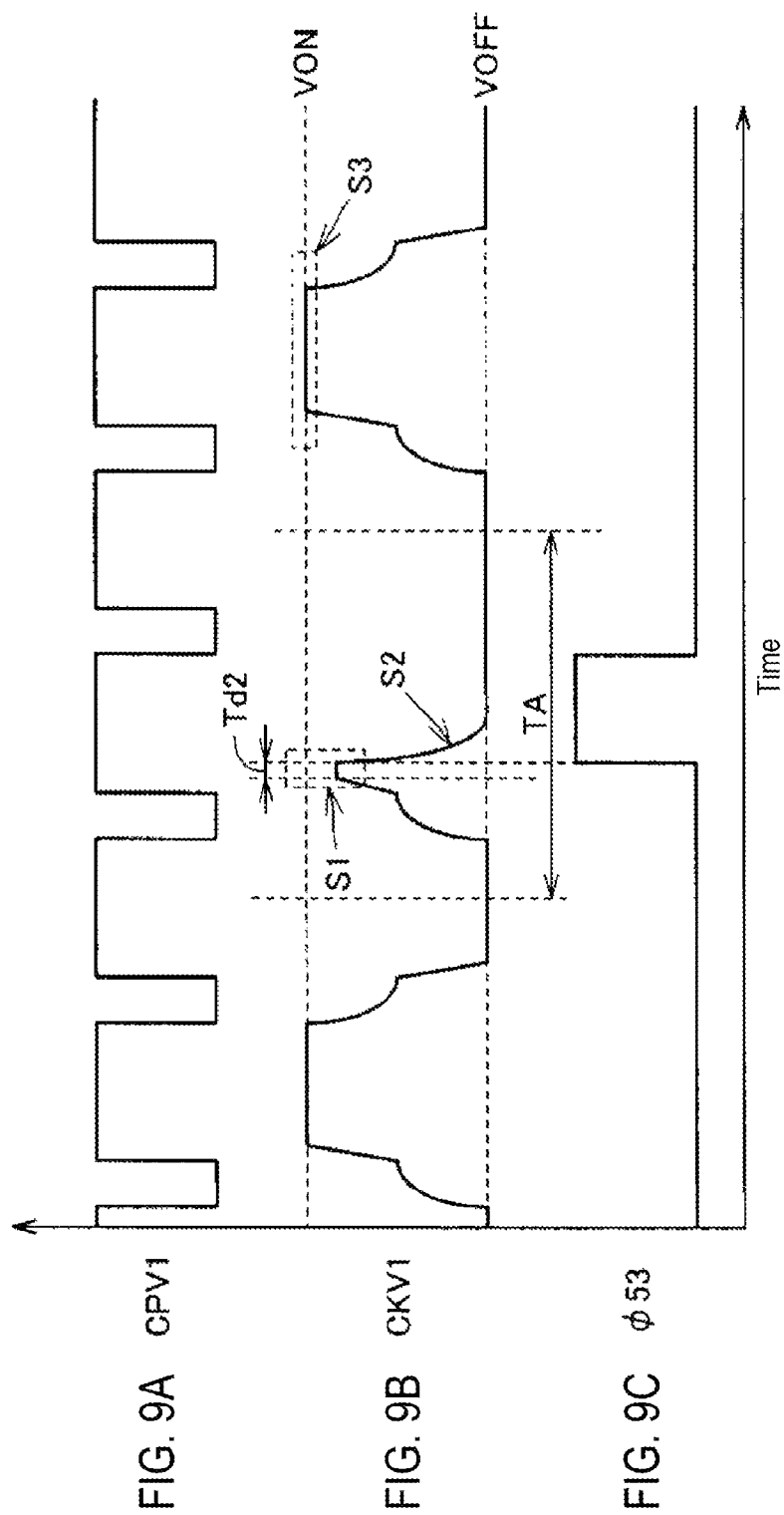
FIGS. 9A to 9C are timing charts showing an operation of an overcurrent detector 53 shown in FIG. 8.

FIGS. 9A to 9C are timing charts showing an operation of the IC 7 when a gate line GL applied with a signal CKV1 at interval TA is circuit-shorted to a line of negative voltage VOFF through a defect. In this case, no overcurrent flows when a negative voltage VOFF is applied to the gate line GL, whereas overcurrent flows in the transistor P when a positive voltage VON is applied to the gate line GL.

When the overcurrent flows into the transistor P as a signal CPV1 rises to an "H" level, a voltage drop V1 occurs in the transistor P and the signal CKV1 does not reach the positive voltage VON, as denoted by S1 in FIG. 9B. If the signal CKV1 is lower by the threshold voltage VTP or above than the positive voltage VON at S1, a signal φ53 rises to an "H" level after lapse of delay time Td2 of the overcurrent detector 53, thereby turning off the transistor P. When the transistor P is turned off, the signal CKV1 decreases to the negative voltage VOFF, as denoted by S2 in FIG. 9B. When the signal CPV1 falls to an "L" level, the signal φ53 falls to an "L" level.

If a gate line GL applied with the signal CKV1 at the next interval is normal, no overcurrent flows in the transistor P and the signal CKV1 reaches the positive voltage VON, as denoted by S3 in FIG. 9B, thereby keeping the signal φ53 at the "L" level. Thus, the transistor P is protected against overcurrent. However, overcurrent flows into the transistor P every time a gate line GL circuit-shorted to a line of negative voltage VOFF is selected, thereby raising a temperature of the transistor P.

Figure 10:
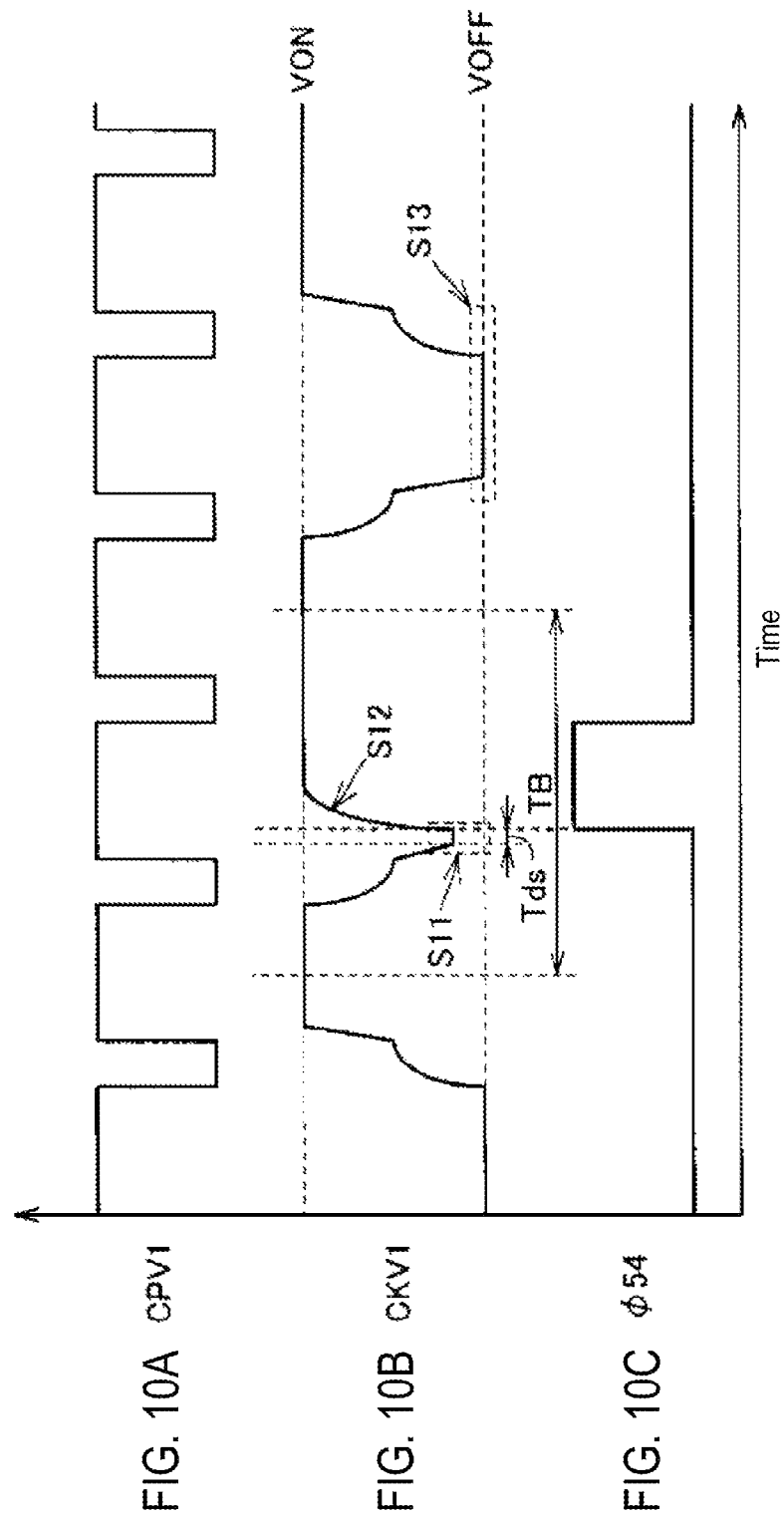
FIGS. 10A to 10C are timing charts showing an operation of an overcurrent detector 54 shown in FIG. 8.

FIGS. 10A to 10C are timing charts showing an operation of the IC 7 when a gate line GL applied with a signal CKV1 at interval TB is circuit-shorted to a line of positive voltage VON through a defect. In this case, no overcurrent flows when a positive voltage VON is applied to the gate line GL, whereas overcurrent flows in the transistor Q when a negative voltage VOFF is applied to the gate line GL.

When the overcurrent flows into the transistor Q as a signal CPV1 rises to an "H" level, a voltage drop V2 occurs in the transistor Q and the signal CKV1 does not reach the negative voltage VOFF, as denoted by S11 in FIG. 10B. If the signal CKV1 is lower by the threshold voltage VTN or above than the negative voltage VOFF at S11, a signal φ54 rises to an "H" level after lapse of delay time Td2 of the overcurrent detector 54, thereby turning off the transistor Q. When the transistor Q is turned off, the signal CKV1 increases to the positive voltage VON, as denoted by S12 in FIG. 10B. When the signal CPV1 falls to an "L" level, the signal φ54 falls to an "L" level.

If a gate line GL applied with the signal CKV1 at the next interval is normal, no overcurrent flows in the transistor Q and the signal CKV1 reaches the negative voltage VOFF, as denoted by S13 in FIG. 10B, thereby keeping the signal φ54 at the "L" level. Thus, the transistor Q is protected against overcurrent. However, overcurrent flows into the transistor Q every time a gate line GL circuit-shorted to a line of positive voltage VON is selected, thereby raising a temperature of the transistor Q.

FIGS. 11A to 11D are timing charts showing an operation of the IC 7 when two gate lines GL applied with signals CKV1 and CKVB1 at interval TC are circuit-shorted to each other through a defect. In this case, overcurrent flows into the transistors P and Q when a positive voltage VON and a negative voltage VOFF are applied to the two gate lines GL, respectively.

Figure 11:
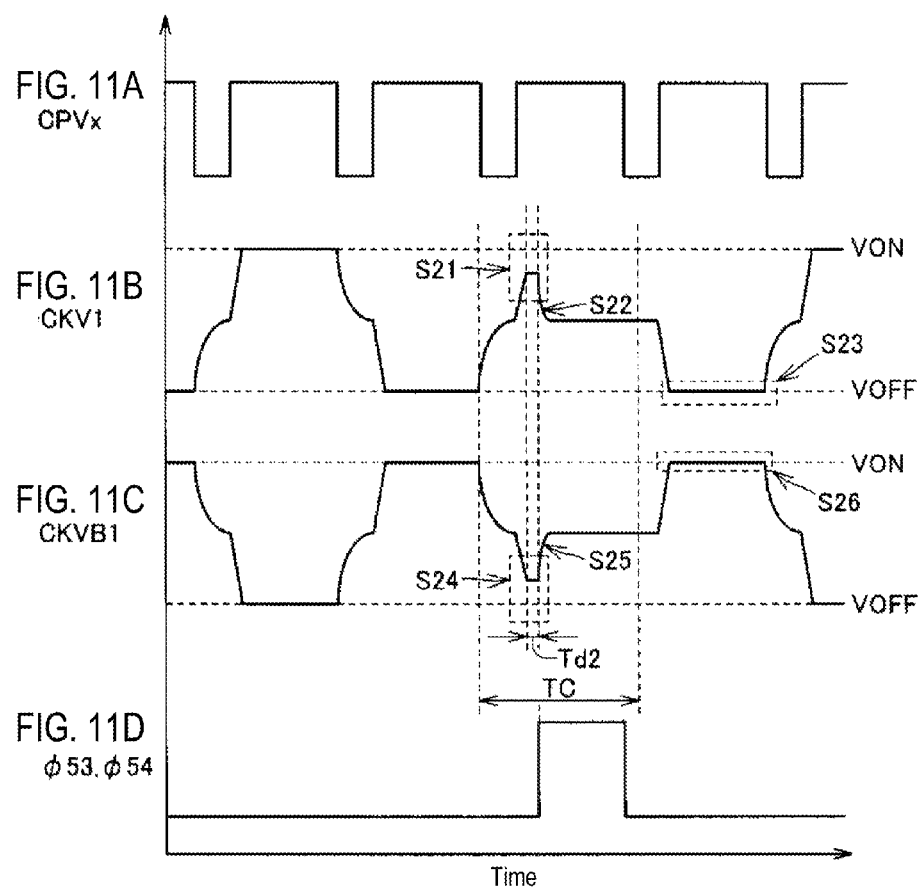
FIGS. 11A to 11D are timing charts showing an operation of the overcurrent detectors 53 and 54 shown in FIG. 8.

When the overcurrent flows into the transistors P and Q as a signal CPVx rises to an "H" level, voltage drops V1 and V2 occur in the transistors P and Q, respectively, and the signals CKV1 and CKVB1 do not reach the positive voltage VON and the negative voltage VOFF, as denoted by S21 and S24 in FIG. 11B, respectively. If overcurrent is detected in S21 and S24, signals φ53 and φ54 rise to an "H" level after lapse of delay time Td2 of the overcurrent detectors 53 and 54, thereby turning off the transistors P and Q. When the transistors P and Q are turned off, voltages of the signals CKV1 and CKVB1 are changed to a middle voltage (VON+VOFF)/2, as denoted by S22 and S25 in FIG. 11B, respectively. When the signal CPVx falls to an "L" level, the signals φ53 and φ54 fall to an "L" level.

If two gate lines GL applied respectively with the signals CKV1 and CKVB1 at the next interval are normal, no overcurrent flows in the transistors P and Q and the signals CKV1 and CKVB1 reach the negative voltage VOFF and the positive voltage VON, as denoted by S23 and S26 in FIG. 11B, respectively, thereby keeping the signals φ53 and φ53 at the "L" level. Thus, the transistors P and Q are protected against overcurrent. However, overcurrent flows into the transistors P and Q every time the two circuit-shorted gate lines GL are selected, thereby raising temperatures of the transistors P and Q.

In this embodiment, when the number of times by which the signals DET1 to DET5 have the "H" level in the IC 7 reaches a predetermined number (for example, 4), the IC 7 is shut down to stop the supply of the voltages VON and VOFF to the gate lines GL.

Figure 12:
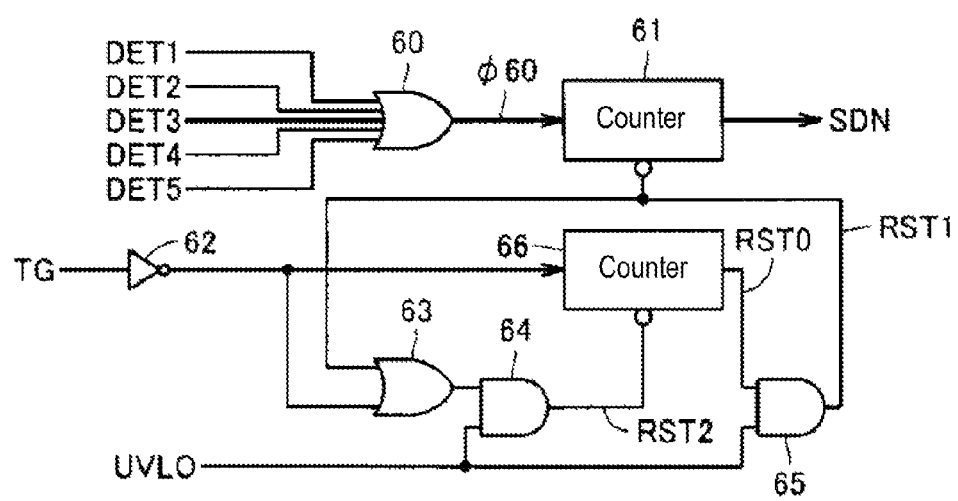
FIG. 12 is a circuit block diagram showing a portion related to shut-down of the IC shown in FIG. 1.
Figure 13:
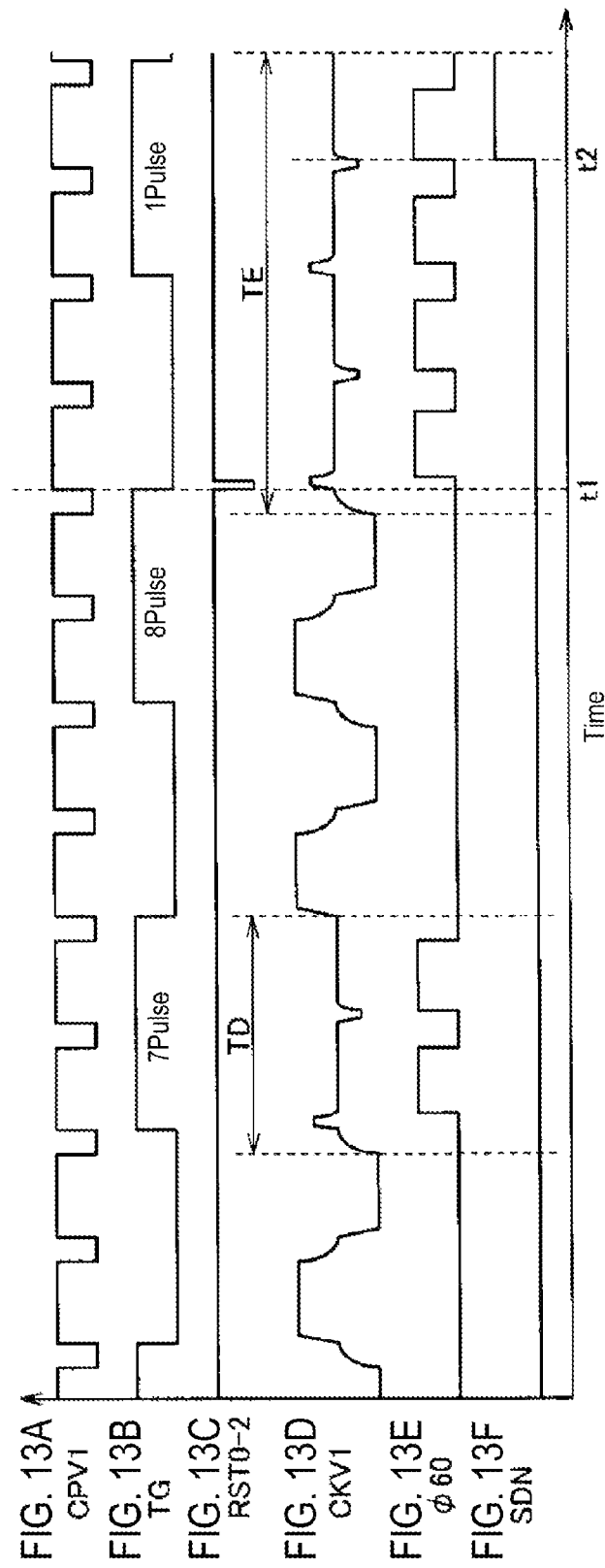
FIGS. 13A to 13F are timing charts showing an operation of a counter shown in FIG. 12.
Figure 14:
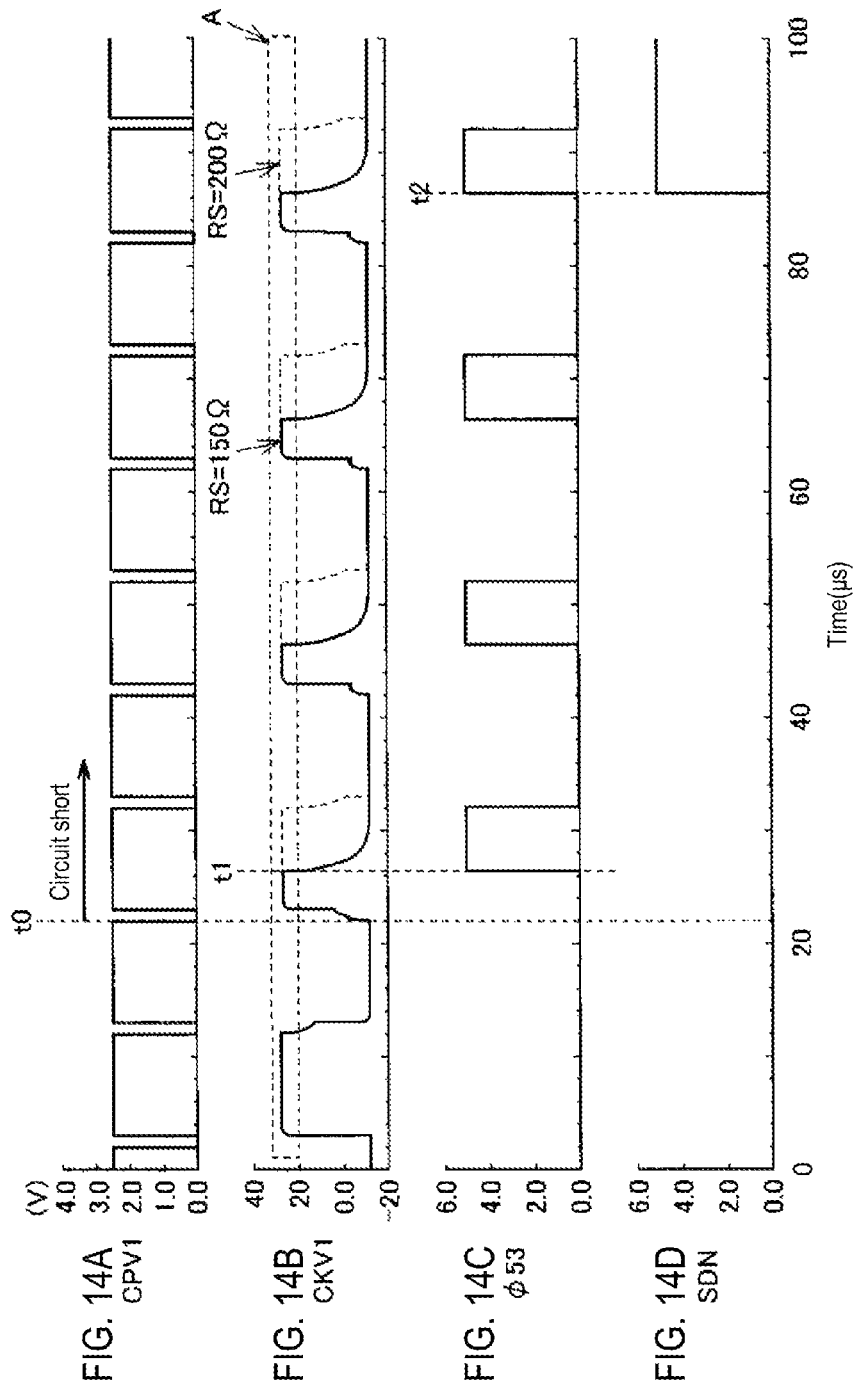
FIGS. 14A to 14D are timing charts showing an operation of the IC in a case where a gate line is circuit-shorted to a line of negative voltage.

FIG. 12 is a circuit block diagram showing a portion related to shut-down of the IC 7 in the gate control circuit 22. As shown in FIG. 12, the gate control circuit 22 includes OR gates 60 and 63, counters 61 and 66, an inverter 62 and AND gates 64 and 65.

The OR gate 60 outputs an OR signal φ60 resulting from an OR operation for the signals DET1 to DET5. The counter 61 is reset when a reset signal RST1 has an "L" level as an active level, counts the number of pulses of the signal φ60, and raises a shut-down signal SDN to an "H" level as an active level to shut down the IC 7 when a value of the count reaches 4. When the shut-down signal SDN has the "H" level, the IC 7 is entirely shut down to stop the supply of the voltages VON and VOFF to the gate lines GL.

A toggle signal TG is provided to the counter 66 via the inverter 62. The toggle signal TG is a clock signal having a period four times as large as that of the signal CPV1. The counter 66 is reset when a reset signal RST2 has an "L" level as an active level, counts the number of pulses of an output signal of the inverter 62, and drops a reset signal RST0 to an "L" level as a value of the count reaches 8.

The OR gate 63 outputs an OR signal resulting from an OR operation for the output signal of the inverter 62 and the reset signal RST1. The AND gate 64 outputs an AND signal resulting from an AND operation for the OR signal from the OR gate 63 and the signal UVLO.

If the signal UVLO has an "L" level with no input of the positive voltage VON, both of the output signals RST2 and RST1 of the AND gates 64 and 65 has an "L" level to reset both of the counters 61 and 66. Accordingly, the output signals SDN and RST0 of the counters 61 and 66 have an "L" level and an "H" level, respectively.

If the signal UVLO has an "H" level with an input of the positive voltage VON, both of the output signals RST2 and RST1 of the AND gates 64 and 65 has an "H" level to allow both of the counters 61 and 66 to start a counting operation.

For example, if a gate line GL is circuit-shorted to a line of positive voltage VON or negative voltage VOFF through a defect and the count value of the counter 61 reaches 4, the shut-down signal SDN rises to the active level, i.e., the "H" level, to shut down the IC 7.

For example, if the signal φ60 rises to an "H" level due to a noise and the count value of the counter 61 stops at, for example, 1, the shut-down signal SDN keeps at an "L" level and the gate line GL continues to be driven. If the count value of the counter 66 reaches 8, the reset signal RST0 falls to an "L" level. Accordingly, the reset signals RST1 and RST2 also fall to an "L" level and the counters 61 and 66 are reset. The count value of the counter 61 becomes 0 to keep the shut-down signal SDN at an "L" level, the count value of the counter 66 is reset to 0 to render the reset signals RST0 to RST2 into an "H" level, and the resets of the counters 61 and 66 are released.

FIGS. 13A to 13F are timing charts showing an operation of the IC 7. A signal CPV1 is a clock signal having a predetermined period. A toggle signal TG is a clock signal having a period four times as large as that of the signal CPV1. The counter 66 counts the number of falling edges of the toggle signal TG and drops a reset signal RST0 to an "L" level as a value of the count reaches 8. When the reset signal RST0 falls to the "L" level, reset signals RST1 and RST2 fall to an "L" level to reset the counters 61 and 66 and then the reset signals RST0 to RST2 rise to an "H" level.

In interval TD, two gate lines GL1 and GL2 corresponding to the signals CKV1 and CKVB1 in FIG. 4 are circuit-shorted for two periods of the signal CPV1. If the circuit-short of the signals CKV1 and CKVB1 is detected, the signal φ60 in FIG. 12 rises to an "H" level. When the signal CPV1 falls to an "L" level, the signal φ60 falls to an "L" level. After the end of the interval TD, since the signal φ60 is kept at the "L" level, a count value of the counter 61 stops at 2 and a shut-down signal SDN is kept at an "L" level.

In interval TE, two gate lines GL1 and GL2 corresponding to the signals CKV1 and CKVB1 in FIG. 4 are circuit-shorted for four periods of the signal CPV1. Immediately after the interval TE begins (at time t1), the toggle signal TG falls from the "H" level to the "L" level. In response to this falling edge, the reset signals RST0 to RST2 fall to the "L" level in a pulse manner to reset the counters 61 and 66. Subsequently, the circuit-short of the signals CKV1 and CKVB1 is detected four times and, in response to the fourth rising edge of the signal φ60, the shut-down signal SDN rises to an "H" level (at time t2). When the signal SDN rises to the "H" level, the IC 7 is shut down to stop the driving of the gate lines GL.

Figure 15:
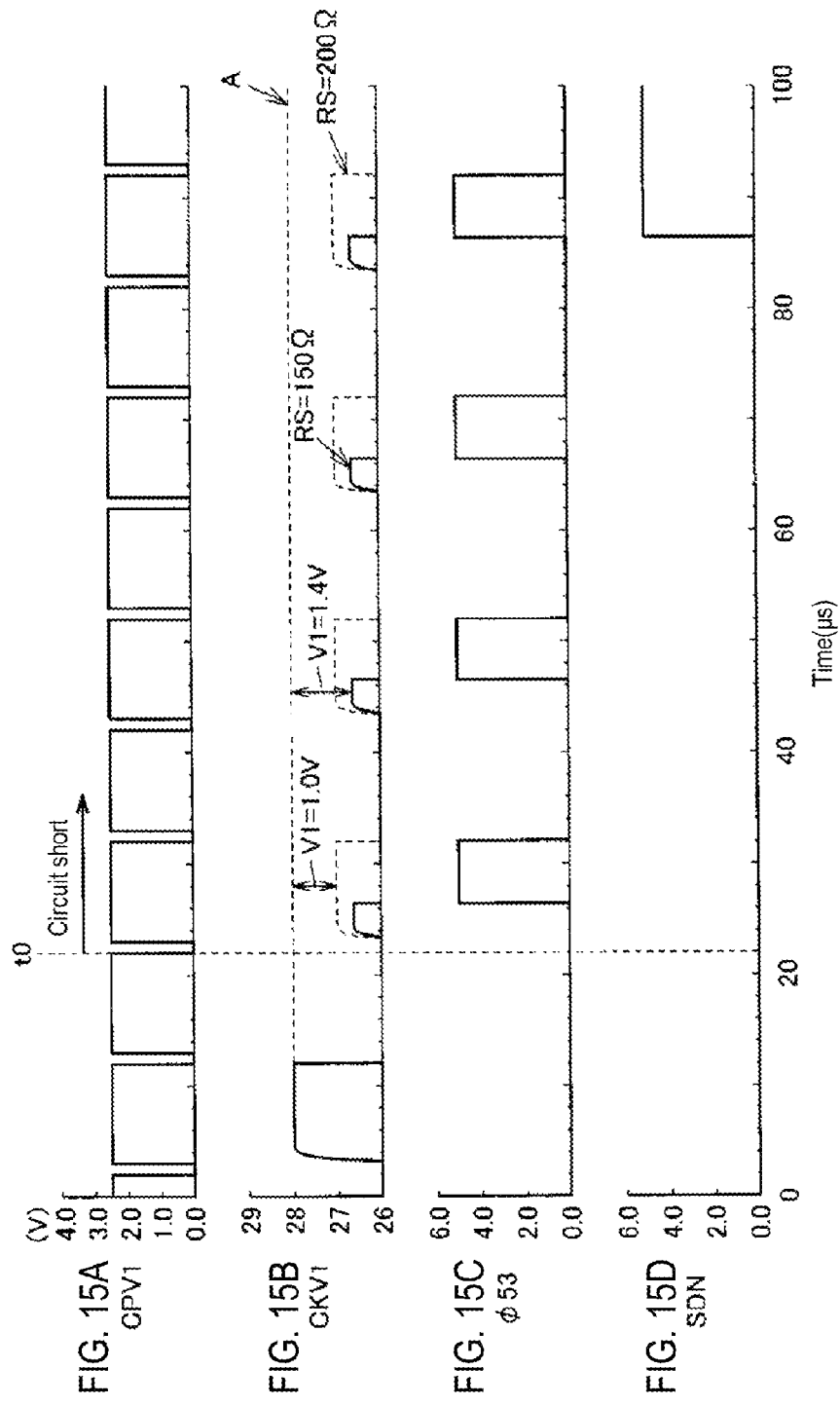
FIGS. 15A to 15D are timing charts showing the operation of the IC in a case where a gate line is circuit-shorted to a line of negative voltage, FIGS. 15A, 15C and 15D being the same as FIGS. 14A, 14C and 14D, respectively, and FIG. 15B being an enlarged view in a longitudinal axis of a portion A in FIG. 14B.
Figure 16:
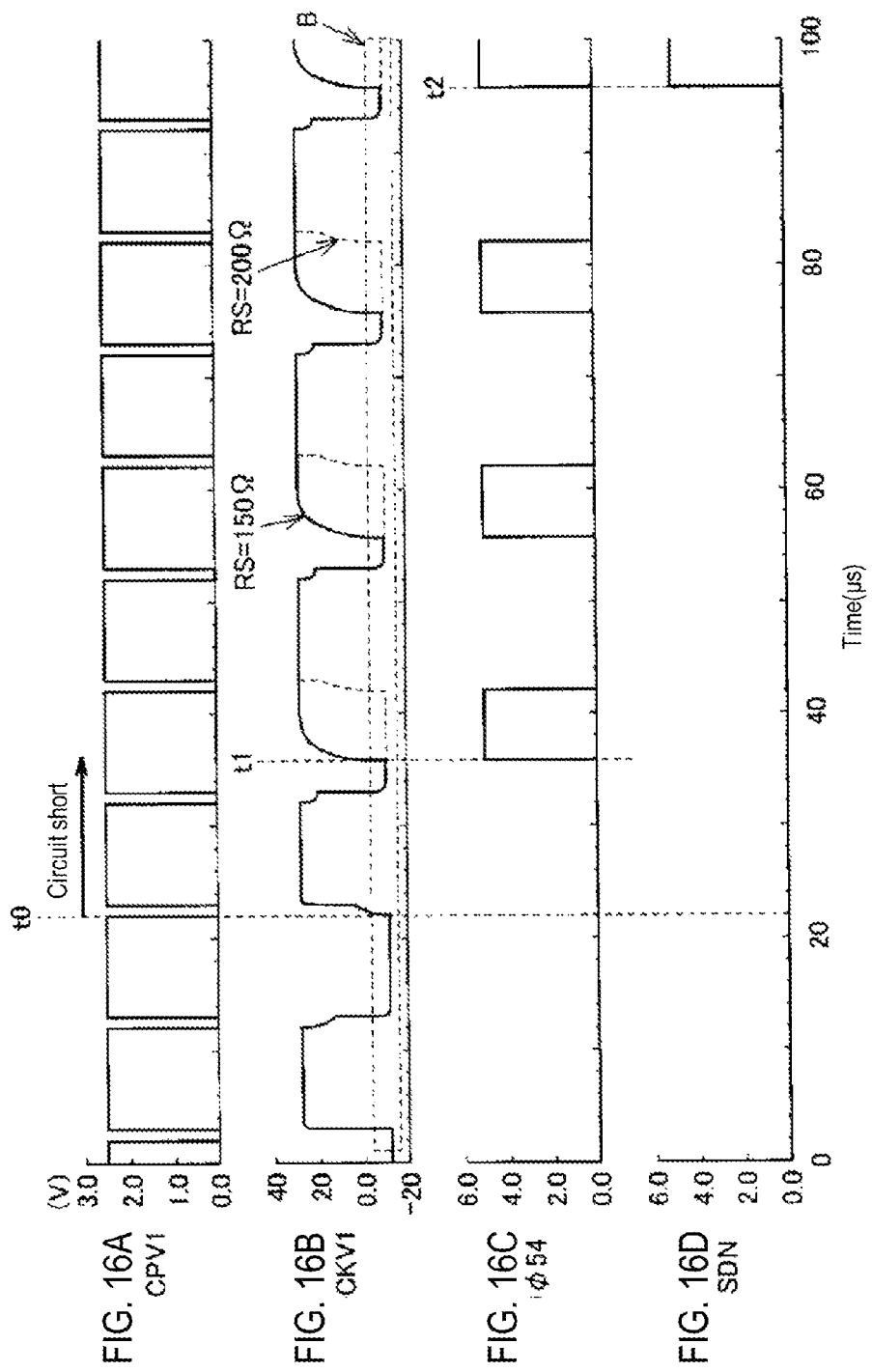
FIGS. 16A to 16D are timing charts showing an operation of the IC in a case where a gate line is circuit-shorted to a line of positive voltage.

FIGS. 14A to 14D are timing charts showing a result of simulation for an operation of the IC 7 in a case where the gate line GL1 is circuit-shorted to a line of negative voltage VOFF through a resistive element. FIGS. 15A, 15C and 15D are the same as FIGS. 14A, 14C and 14D, respectively, and FIG. 15B is an enlarged view in a longitudinal axis of a portion A in FIG. 14B.

Simulations on cases where resistance Rs of the resistive element is 150Ω and 200Ω were performed. A waveform of a signal CKV1 for Rs=150Ω is indicated by a solid line in FIG. 14B and a waveform of a signal CKV1 for Rs=200Ω is indicated by a dotted line in FIG. 15B.

When the gate line GL was circuit-shorted to a line of negative voltage VOFF through the resistive element of Rs=200Ω (at time t0), an "H" level of the signal CKV1 was lower by 1.0V than a positive voltage VON. In this case, since a voltage drop V1 (=1.0V) at the P channel MOS transistor P is smaller than the threshold voltage VTP (=1.2V) of the overcurrent detector 53, the signal φ53 and the shut-down signal SDN were kept at an "L" level.

In addition, when the gate line GL was circuit-shorted to a line of negative voltage VOFF through the resistive element of Rs=150Ω (at time t0), an "H" level of the signal CKV1 was lower by 1.4V than a positive voltage VON. In this case, since a voltage drop V1 (=1.4V) at the P channel MOS transistor P is larger than the threshold voltage VTP (=1.2V) of the overcurrent detector 53, the signal φ53 rose from an "L" level to an "H" level (at time t1).

When the signal φ53 has the "H" level, the transistor P is turned off to decrease the signal CKV1 to the negative voltage VOFF. When the signal CPV1 falls to an "L" level, the signal φ53 falls to the "L" level. At the point of time when a rising edge of the signal φ53 was counted four times, the shut-down signal SDN rose from an "L" level to an "H" level (at time t2).

Figure 17:
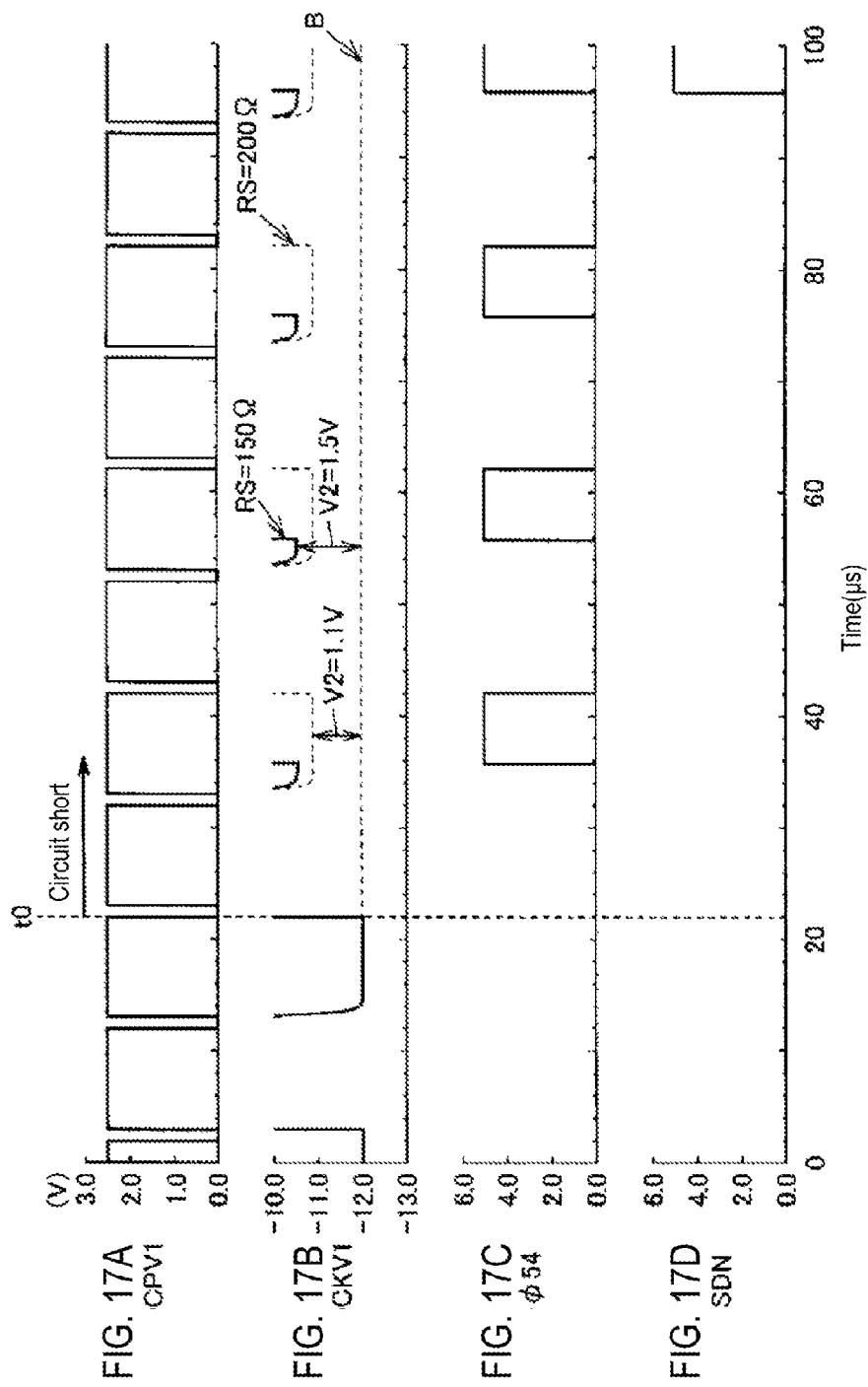
FIGS. 17A to 17D are timing charts showing the operation of the IC in a case where a gate line is circuit-shorted to a line of positive voltage, FIGS. 17A, 17C and 17D being the same as FIGS. 16A, 16C and 16D, respectively, and FIG. 17B being an enlarged view in a longitudinal axis of a portion B in FIG. 16B.

FIGS. 16A to 16D are timing charts showing a result of simulation for an operation of the IC 7 in a case where the gate line GL1 is circuit-shorted to a line of positive voltage VON through a resistive element. FIGS. 17A, 17C and 17D are the same as FIGS. 16A, 16C and 16D, respectively, and FIG. 17B is an enlarged view in a longitudinal axis of a portion B in FIG. 16B.

Simulations on cases where resistance Rs of the resistive element is 150Ω and 200Ω were performed. A waveform of a signal CKV1 for Rs=150Ω is indicated by a solid line in FIG. 16B and a waveform of a signal CKV1 for Rs=200Ω is indicated by a dotted line in FIG. 17B.

When the gate line GL was circuit-shorted to a line of positive voltage VON through the resistive element of Rs=200Ω (time t0), an "L" level of the signal CKV1 was higher by 1.1V than a negative voltage VOFF. In this case, since a voltage drop V2 (=1.1V) at the N channel MOS transistor Q is smaller than the threshold voltage VTN (=1.2V) of the overcurrent detector 54, the signal φ54 and the shut-down signal SDN were kept at an "L" level.

In addition, when the gate line GL was circuit-shorted to a line of positive voltage VON through the resistive element of Rs=150Ω (at time t0), an "L" level of the signal CKV1 was higher by 1.5V than a negative voltage VOFF. In this case, since a voltage drop V2 (=1.5V) at the N channel MOS transistor Q is larger than the threshold voltage VTN (=1.2V) of the overcurrent detector 54, the signal φ54 rose from an "L" level to an "H" level (at time t1).

When the signal φ54 has the "H" level, the transistor Q is turned off to increase the signal CKV1 to the positive voltage VON. When the signal CPV1 falls to an "L" level, the signal φ54 falls to the "L" level. At the point of time when a rising edge of the signal φ54 was counted four times, the shut-down signal SDN rose from an "L" level to an "H" level (at time t2).

As described above, in this embodiment, the number of times by which overcurrent flows into the transistors P and Q is counted and the IC 7 is shut down when the counted number is four. Accordingly, it is possible to protect the IC 7 against overcurrent and realize the IC 7 resistant to noises.

Figure 18:
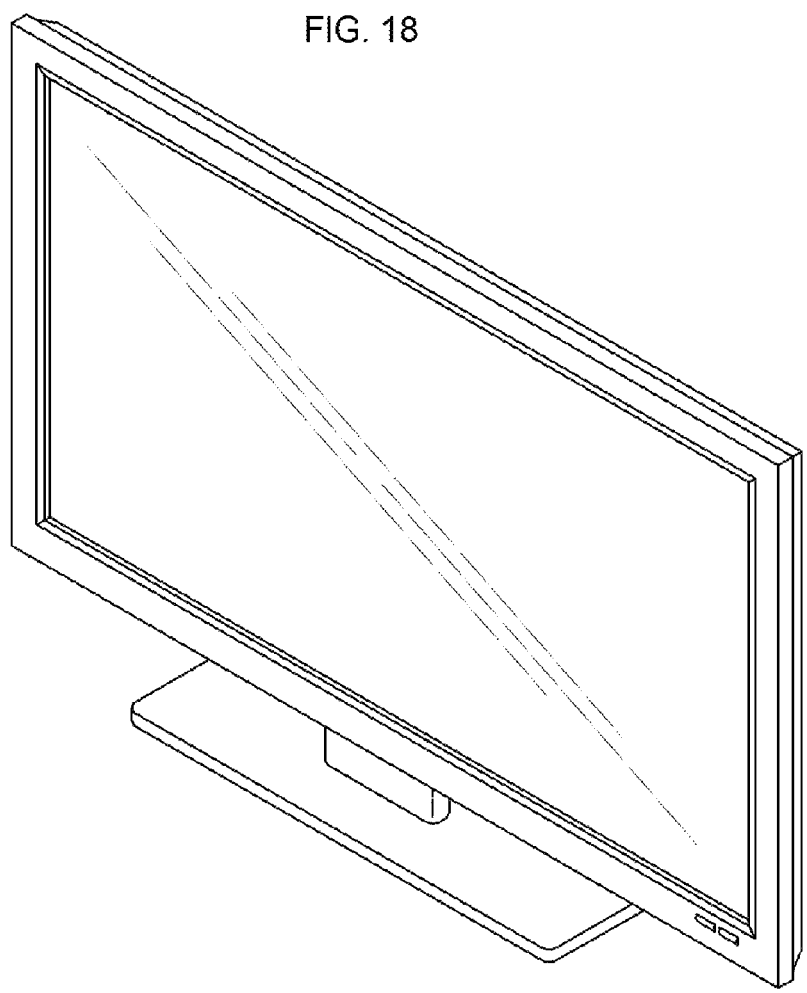
FIG. 18 is a perspective view showing a television set including the liquid crystal display of FIG. 1.

Further, the liquid crystal display of the present disclosure may be used for various electronic devices such as a television set. FIG. 18 is a perspective view showing a television set 100 including the liquid crystal display of FIG. 1.

According to the present disclosure in some embodiments, the driver circuit counts the number of times by overcurrent flows into transistors and stops an operation of the driver circuit if the count value reaches a predetermined value of equal to or more than 2. Accordingly, the transistors can be protected against overcurrent. In addition, since the driver circuit continues to be operated until the number of times by which overcurrent flows into the transistors reaches the predetermined value, it is possible to prevent the driver circuit from malfunctioning due to noises.

While certain embodiments have been described, these embodiments have been presented by way of example only, and are not intended to limit the scope of the disclosures. Indeed, the novel methods and apparatuses described herein may be embodied in a variety of other forms, furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A driver circuit comprising:
   a first transistor connected between a line of first voltage and an output terminal;
   a first overcurrent detector configured to output a first signal when overcurrent flows into the first transistor;
   a first control unit configured to turn on and off the first transistor at a predetermined period and turn off the first transistor when the first signal is output from the first overcurrent detector;
   a counter configured to count the number of times by which the first signal is output from the first overcurrent detector within a predetermined time interval, and to output a shut-down signal to stop an operation of the driver circuit as a value of the count reaches a predetermined value of equal to or more than 2;
   a second transistor connected between the output terminal and a line of second voltage lower than the first voltage;
   a second overcurrent detector configured to output a second signal when overcurrent flows into the second transistor; and
   a second control unit configured to turn on and off the second transistor alternately at a predetermined period and turn off the second transistor when the second signal is output from the second overcurrent detector,
   wherein the first and second transistors are alternately turned on,
   wherein the counter counts the number of times by which the first and second signals are output from the first and second overcurrent detectors within the predetermined time interval, and outputs the shut-down signal as a value of the count reaches the predetermined value,
   wherein two sets of the output terminals, the first and second transistors, the first and second overcurrent detectors and the first and second control units are provided,
   wherein the two first transistors are alternately turned on and the two second transistors are alternately turned on,
   wherein the counter counts the number of times by which the first and second signals are output from the two sets of the first and second overcurrent detectors within the predetermined time interval, and outputs the shut-down signal as a value of the count reaches the predetermined value,
   wherein, between a first time interval during which one set of the first transistor and the other set of the second transistor are turned on and a second time interval during which one set of the second transistor and the other set of the first transistor are turned on, a third time interval during which both sets of the first and second transistors are turned off is provided,
   wherein the two output terminals are connected to two load circuits, respectively, and
   wherein the driver circuit further comprises a charge sharing circuit configured to interconnect the two output terminals during the third time interval and flow current from one of the load circuits, which is charged with the first voltage, to the other of the load circuits, which is charged with the second voltage.

2. The driver circuit of claim 1, wherein the first voltage is a positive voltage and the second voltage is a negative voltage.

3. The driver circuit of claim 1, wherein the output terminal is connected to a gate line of a liquid crystal display panel.

4. A television set including the driver circuit of claim 1.

* * * * *